United States Patent [19]

Smayling et al.

[11] Patent Number: 5,557,569
[45] Date of Patent: Sep. 17, 1996

[54] LOW VOLTAGE FLASH EEPROM C-CELL USING FOWLER-NORDHEIM TUNNELING

[75] Inventors: Michael C. Smayling, Missouri City, Tex.; Giulio G. Marotta, Rieti, Italy; Iano D'Arrigo, Cannes, France; Giovanni Santin, Rieti, Italy; Georges Falessi, La Gaude, France; Mousumi Bhat, Austin, Tex.

[73] Assignee: Texas Instruments Incorporated

[21] Appl. No.: 453,474

[22] Filed: May 25, 1995

Related U.S. Application Data

[63] Continuation of Ser. No. 135,695, Oct. 12, 1993, abandoned.

[51] Int. Cl.⁶ ........................................ G11C 16/04
[52] U.S. Cl. .......................... 365/185.28; 365/185.16; 365/185.33; 257/316
[58] Field of Search ....................... 365/185, 218, 365/900, 63, 72; 257/316

[56] References Cited

U.S. PATENT DOCUMENTS

| | | | |
|---|---|---|---|
| 4,328,565 | 5/1982 | Harari | 365/185 |
| 4,698,787 | 10/1987 | Mukherjee et al. | 365/185 |
| 4,742,492 | 5/1988 | Smaylinh et al. | 365/218 |
| 4,769,787 | 9/1988 | Furusawa et al. | 365/185 |
| 4,839,705 | 6/1989 | Tigelaar et al. | 365/185 |
| 4,912,676 | 3/1990 | Paterson et al. | 365/185 |
| 5,016,215 | 5/1991 | Tigelaar | 365/185 |
| 5,021,847 | 6/1991 | Eitan et al. | 365/185 |
| 5,031,148 | 7/1991 | Kitazawa et al. | 365/185 |
| 5,115,288 | 5/1992 | Manley | 365/185 |
| 5,227,326 | 7/1993 | Walker | 437/52 |
| 5,235,544 | 8/1993 | Caywood | 365/900 |
| 5,274,588 | 12/1993 | Manzur et al. | 365/185 |
| 5,303,184 | 4/1994 | Noda | 365/185 |
| 5,306,658 | 4/1994 | Gill | 437/52 |
| 5,306,935 | 4/1994 | Esquivel et al. | 257/315 |
| 5,323,351 | 6/1994 | Challa | 365/218 |
| 5,341,342 | 8/1994 | Brahnbhatt | 365/900 |
| 5,365,082 | 11/1994 | Gill et al. | 257/374 |
| 5,418,741 | 5/1995 | Gill | 365/185 |
| 5,432,740 | 7/1995 | D'Arrigo et al. | 365/185 |

*Primary Examiner*—Joseph E. Clawson, Jr.
*Attorney, Agent, or Firm*—Robert D. Marshall, Jr.; James C. Kesterson; Richard L. Donaldson

[57] ABSTRACT

A low voltage flash EEPROM X-Cell includes an array of memory cell transistors (24) that constitute asymmetric floating gate memory cells wherein programming is achieved on only one side of the memory cells (24). The programming side of each of the memory cells (24) is connected to one of a plurality of Column Lines (28) at nodes (30). Each node (30) shares the programming side of two of the memory cells (24) and the non-programming side of two of the memory cells (24). The control gates of each of the memory cells (24) are connected to Word Lines (26) associated with rows of the array. To Flash Write all of the memory cells (24), the Column Lines (38) are connected to a negative medium voltage and the row lines (26) are connected to a positive medium voltage. To selectively erase one of the memory cells (24), the Column Line (28) associated with the programming side of the select memory cell transistor is connected to a positive medium voltage and the associated line (26) is connected to a positive Read voltage. The remaining Word Lines are connected to a negative Read voltage and the remaining Column Lines (28) are connected to a zero volt level.

6 Claims, 4 Drawing Sheets

LOW VOLTAGE FLASH EEPROM C-CELL USING FOWLER-NORDHEIM TUNNELING

This application is a continuation of U.S. patent application Ser. No. 08/135,695, filed Oct. 12, 1993.

TECHNICAL FIELD OF THE INVENTION

The present invention pertains in general to an erasable electrically programmable memory cell (EEPROM) and its related driving circuitry, and more particularly, to an EEPROM cell utilizing low voltage transistors.

BACKGROUND OF THE INVENTION

Conventional EEPROMs typically employ three to four transistors, which include a tunnel diode device coupled to the floating gate of the sense transistor to charge the latter and a select or row transistor to activate the cell. The use of three or four transistors to realize a cell substantially limits the size reduction possible for EEPROM arrays. Furthermore, typical EEPROM cells require the application of voltages in excess of 15 volts. This therefore requires special processing to reduce leakage and a larger layout to avoid unwanted field transistor turn-on, i.e., the use of high voltage transistors typically have longer channel lengths, and therefore, significantly larger sizes. This is especially the case with respect to the row transistor, since high voltage is applied to the source during the ERASE mode. The peripheral driving circuitry also requires higher voltage transistors to handle these high voltage driving signals.

One technique for reducing the voltage is to utilize lower voltages during the programming and the ERASE modes with use of an asymmetric transistor. This is disclosed in U.S. Pat. No. 4,939,558, issued Jul. 30, 1990, which patent is incorporated herein by reference. U.S. Pat. No. 4,939,558, discloses an asymmetric memory cell that utilizes Fowler-Nordheim tunneling techniques, whereby a reach-through region is provided on only one side of the floating gate, such that the tunneling of electrons takes place only on the reach-through side of the gate and, as such, creates an asymmetry in the transistor for the purposes of both programming and erasure.

SUMMARY OF THE INVENTION

The invention disclosed and claimed herein comprises an electrically erasable, electrically programmable Read Only Memory having a memory array associated therewith. The memory array includes a plurality of asymmetric storage transistors arranged in rows and columns, the asymmetric transistors having a control gate, a source and drain separated by channels, and a floating gate. The asymmetric transistors are operable to be programmed by Fowler-Nordheim tunneling from only one side of the channel, which side comprises a programming side of the channel. A plurality of row lines are provided that are associated with each of the rows of asymmetric transistors and connected to the control gates of the associated asymmetric transistors. A plurality of Column Lines are provided, each associated with one of the columns of transistors. Each of the transistors has the source thereof connected to one of the Column Lines and the drain thereof connected to another of the Column Lines. At least two of the transistors in the same row have one of the source or drains thereof connected to a common one of the Column Lines, such that the programming side of only one of the at least two transistors is connected to the common Column Line. Flash Write circuitry is provided for negatively charging the floating gates of substantially all the asymmetric transistors. Each of the transistors can be selected erased for bit-wide programming by selectively removing charge therefrom. Read circuitry is provided for selectively determining if the floating gate for a select one of the at least two transistors is negatively charged.

In another aspect of the present invention, the transistors are arranged in an X-Cell configuration wherein the programming side of the transistors comprises the source with transistors from two adjacent modes having the sources thereof connected to the common Column Line and the other two transistors being from two rows with the drain thereof connected to the common Column Line.

In yet another aspect of the present invention, the flash Write circuitry is operable to connect a negative voltage to the control gates of all the transistors and a positive voltage to the sources and drains of all the transistors to selectively remove the negative charge from the floating gate of a select one of the transistors, a negative voltage is disposed on the row line associated with the select transistor and a positive voltage is disposed on the source of the select transistor, this associated with the programming side of the select transistor. The drain of the select transistor is connected to ground, as are the remaining row lines and the remaining Column Lines. The positive voltage is disposed at a medium voltage and the negative voltage is disposed at a negative medium voltage that is less than ground, such that the field across the gate/source is reduced. To utilize the negative medium voltage, the transistors are disposed in a high voltage tank.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
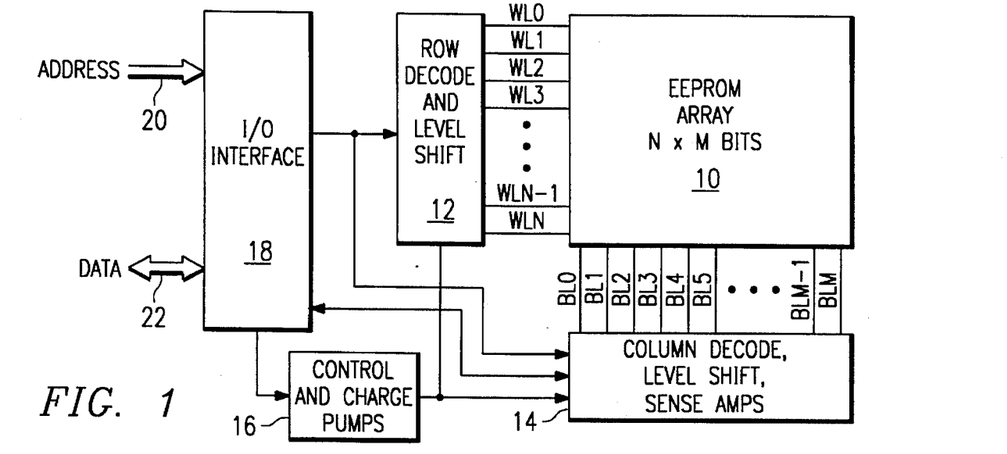
FIG. 1 illustrates a block diagram of the EEPROM.

Referring now to FIG. 1, there is illustrated a schematic block diagram of the architecture of an EEPROM memory which may stand alone as an independent integrated circuit, as well as being incorporated within a much higher level integrated circuit as a single module in that integrated circuit. The EEPROM memory includes an array 10 of memory cells which are arranged as N-rows and M-columns to provide an array of N×M bits. In a typical example, the array could be arranged to have 256 words with 8 bits per word, for a total of 2048 bits. These may be organized in an array of, for example, 32 rows by 64 columns, or 64 rows by 32 columns.

Each of the bits in the array 10 is associated with an EEPROM memory cell, as will be described hereinbelow. Each of the memory cells requires a dedicated Word Line and Bit Line with adjacent Word Lines and Bit Lines also utilized in the programming, as will also be described hereinbelow. A row decoder and level shifter 12 is provided for interfacing with the Word Lines to drive the Word Lines to the appropriate voltages. A column decoder, level shifter and sense amplifier section 14 is operable to drive the Bit Lines with the appropriate voltages and, during the Read operation, to attach the appropriate Bit Lines to sense amplifiers.

A block 16 includes circuitry for controlling the timing of the access to the EEPROM array 10 and charge pumps for providing control signals and appropriate voltages to the array 10, the row decode and level shift block 12 and the column decode, level shift and sense amplifier section 14. The control and charge pump block 16 is connected to an input/output (I/O) interface 18, which provides an interface with either the rest of the chip or with an external chip or device to receive address signals therefrom and also input and output data. The I/O interface 18 uses addresses from an address bus 20 and receives data from and transfers data to a data bus 22.

Figure 2:
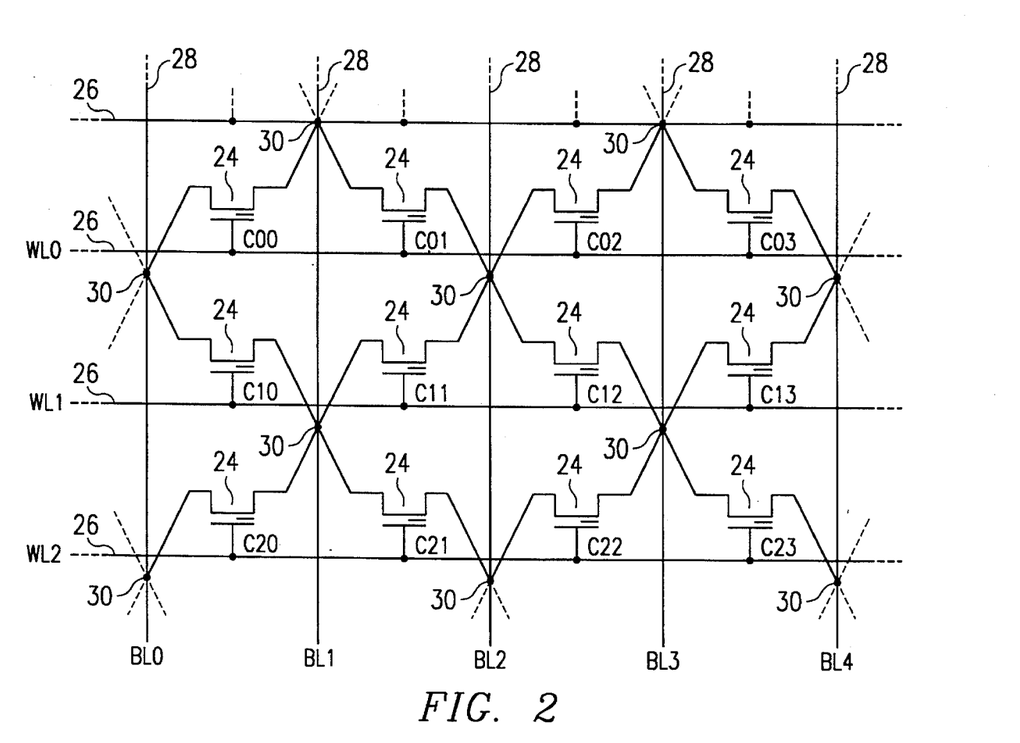
FIG. 2 illustrates a schematic diagram of the array.

Referring now to FIG. 2, there is illustrated a detailed diagram of the array. A plurality of asymmetric EEPROM transistor cells are provided which are asymmetric floating gate cells, as will be described in more detail hereinbelow. The symbol for the memory cells 24 illustrates a floating gate disposed between a control gate and a channel region which is asymmetric in nature, such that the floating gate is disposed on one side only, this being the "programming" side. A plurality of Word Lines 26 are provided, one for each row of memory cells 24, the Word Lines 26 connected to the control gates of respective memory cells 24. A plurality of Column Lines 28 are provided, each connected to a plurality of X-Cell nodes 30 and each designated as a Bit Line. As described above, the column decode, level shift and sense amplifier section 14 is operable to control the connection to each of the Column Lines 28. The architecture of the array of FIG. 2 is a conventional X-Cell, as will be described hereinbelow.

In the example of FIG. 2, three Word Lines 26 are labelled WL0, WL1 and WL2, and five of the Column Lines 28 are labelled BL0, BL1, BL2, BL3 and BL4. The memory cells 24 associated with Word Line WL0 and the Column Lines labelled BL0–BL4 are each labelled C00, C01, C2 and C03. Similarly, the memory cells 24 associated with Word Line WL1 and the Bit Lines BL0–BL4 are labelled C10, C11, C12 and C13. The memory cells 24 associated with the Word Line 26 labelled WL2 and the Column Lines 28 labelled BL0–BL4 are labelled C20, C21, C22 and C23.

Each of the memory cells 24 has the drain thereof connected to one of the X-Cell nodes 30 in one Column Line 28 and the source thereof connected to one of the X-Cell nodes 30 on an adjacent Column Line 28. The source of each of the memory cells 24, as will be described hereinbelow, has the asymmetric reach-through region or "programming" side associated therewith, such that tunneling of electrons occurs only on the source side, and thus can only be programmed from that side. For example, the memory cell 24, labelled C00, has the drain thereof connected to the X-Cell node 30 on Column Line 28 labelled BL0 and the source thereof connected to the X-Cell node 30 on the Column Line 28, labelled BL1.

In order to write to the cells, i.e., to negatively charge the floating gates, it is necessary to dispose the Word Lines 26 at a positive voltage, and the sources and drains thereof at a negative voltage such that a field is impressed across the gate, to allow electrons to tunnel from the source side of each of the memory cells 24 to the floating gates thereof. This can be achieved in two ways. In one method, a high voltage level of approximately 18 volts can be disposed on all of the Word Lines 26 with the Column Lines 28 disposed at ground or zero volts. Alternately, and in the preferred embodiment, the Word Lines 26 are disposed at a medium voltage of approximately 9 volts and the Column Lines 28 are disposed at a negative medium voltage of −9 volts. In order to FLASH ERASE the cells, it is only necessary to then dispose the Word Lines at the negative medium voltage and the Column Lines at the positive medium voltage.

In order to selectively ERASE one of the cells such that individual bit programming can be provided, it is necessary to dispose a positive voltage on the source of a select transistor relative to the control gate thereof. However, it is also important that the remaining voltages of adjacent cells and other cells in the array be disposed such that the charge on the control gate is not disturbed. By way of example, consider the memory cell 24 labelled C11. The following Table 1 illustrates the voltages necessary for both the FLASH WRITE, the ERASE, the READ and FLASH ERASE operation.

TABLE 1

| MODE | WL0 | WL1 | WL2 | BL0 | BL1 | BL2 | BL3 | BL4 |
| --- | --- | --- | --- | --- | --- | --- | --- | --- |
| Flash Write | +MV | +MV | +MV | −MV | −MV | −MV | −MV | −MV |
|  | +HV | +HV | +HV | 0V | 0V | 0V | 0V | 0V |
| Erase C11 | 0V | −MV | 0V | 0V | 0V | +MV | 0V | 0V |
| Read C11 | −Vr | +Vr | −Vr | Float | 0v | Vs | Float | Float |
| Flash Erase | −MV | −MV | −MV | +MV | +MV | +MV | +MV | +MV | where:
HV=High Voltage (18 V)
MV=Medium Voltage (9 V)
Vr=Word Line Read Voltage (3 V)
Vs=Bit Line Sense Voltage (1.2 V)

To erase cell C11, all the Word Lines 26 are disposed at a zero voltage with the exception of WL1, which is disposed at a negative medium voltage. The Column Lines 28 are all disposed at a value of zero volts, with the exception of the BL2 Column Line, this being disposed at a positive medium voltage. Therefore, the programming side of the cell 24 will have a voltage of 18 volts disposed across the associated tunnel diode for the purpose of depleting charge from the floating gate without requiring the high node potentials necessary for a normal EEPROM cell. However, with an X-Cell arrangement, it is important to ensure that all of the memory cells 24 in the row associated with the Word Line 26 labelled WL1 not have the charge therein disturbed and that the memory cells 24 having the sources thereof connected to the Bit Line BL2 not have the charge on the control gates thereof disturbed. Since a positive medium voltage is disposed on all of the sources of the memory cells 24 associated with the Bit Line BL2, each of the memory cells 24 will have at least the medium voltage disposed between the control gate and source thereof. Further, each of the memory cells 24 associated with the Word Line WL1 will also have at least a medium voltage disposed between a control gate and source thereof. For the most part, all of these memory cells 24, with the exception of the memory cell C11 and the memory cell C12, have only the medium voltage disposed between the source and gate thereof. This is an insufficient level to affect the programming operation and perform an erase. However, the memory cell 24 labelled C12 has a negative medium voltage disposed on the control gate thereof and a positive medium voltage disposed on the drain thereof. Since the memory cell 24 is "asymmetric", the tunneling occurs only on the source side, and therefore, the memory cell C12 does not have the charge on the floating gate thereof disturbed. This will be described in more detail hereinbelow.

In order to read the memory cell C11, the Word Line WL1 has a positive read voltage of approximately 3 volts disposed thereon such that the control gate of the memory cell C11 is disposed at 3 volts. All of the Column Lines 28 are allowed to float with the exception of the two Column Lines 28 connected to the source and drain of the memory cell C11. The Column Line 28 associated with the source of the memory cell C11 is connected to the Bit Line sense voltage, which is approximately 1.2 volts and the Column Line 28 associated with the drain of the memory cell C11 is connected to zero volts. Therefore, if a memory cell has been erased it will conduct and, if it has not been erased, it will not conduct. It can also be seen that the Column Lines 28 perform both a virtual ground operation and a sense operation. It will therefore be required for each memory cell to have associated therewith two Column Lines, such that the memory cells at the initial position will have an extra Column Line associated therewith.

Figure 3:
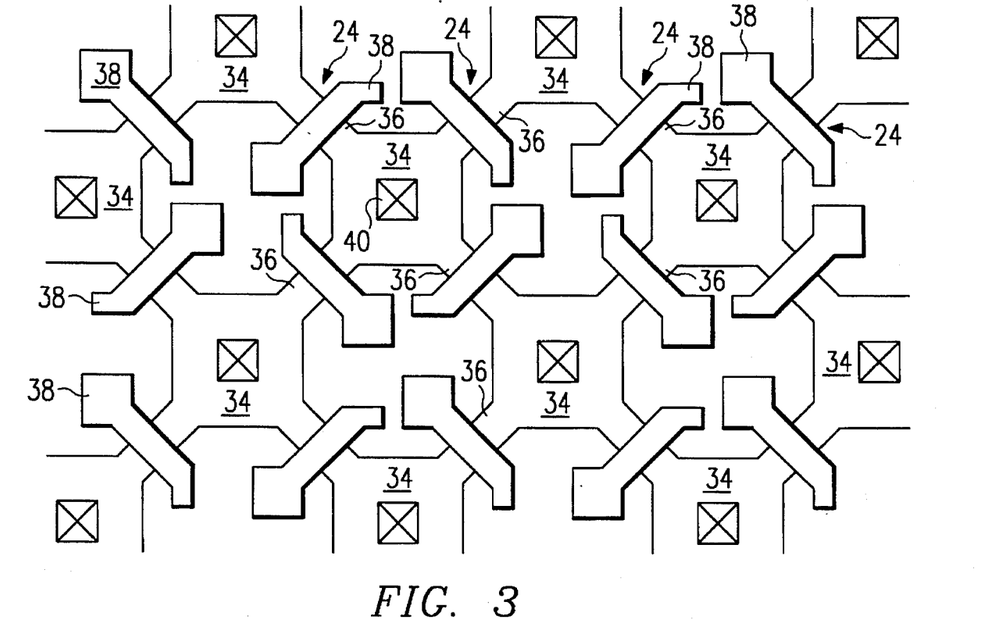
FIG. 3 illustrates a diagrammatic view of the cell layout for the array without the metal level.

Referring now to FIG. 3, there is illustrated a layout for the array of FIG. 2. A plurality of centralized N+ diffusion regions are provided that are arranged in rows and columns and have associated therewith source/drain regions 36 extending from the corners thereof, each of the diffusion regions 34 being substantially rectangular in configuration with the source/drain regions 36 extending from the corners thereof. The diffusion regions 34 are arranged such that they are staggered and the corners of the regions 34 in adjacent rows are aligned to form an X-Cell configuration. A floating gate structure 38 is disposed between the source/drain regions 36 of adjacent diffusion regions 34 to form a channel therebetween. This therefore defines a transistor. The X-Cell configuration is well known and provides a very compact layout structure. However, the present embodiment does not utilize control transistors for bit programming; rather, the asymmetric nature of the transistors and the lower positive voltages provide for smaller low voltage transistors and bit-wide programming without the need for an additional control transistor. The Column Lines 28 are not illustrated, but they are fabricated from upper level metal layers, with a contact 40 disposed in the middle of each of the diffusion regions 34 for contact with the Column Lines 28. The row lines 26 are not illustrated but they are directly over the floating gate structures 38 and are associated with each row of the transistors 24.

During fabrication, the first Poly layer is formed and then the "ends" of the floating gates defined. A layer of interlevel oxide (ILO) is then deposited followed by a second layer of Poly. The second layer of Poly is patterned to define the row lines and the remainder of the floating gate structure 38. This is a self aligned structure to allow for alignment of the source and drain junctions with the edge of the floating gate structure 38, this being a conventional process.

Figure 4:
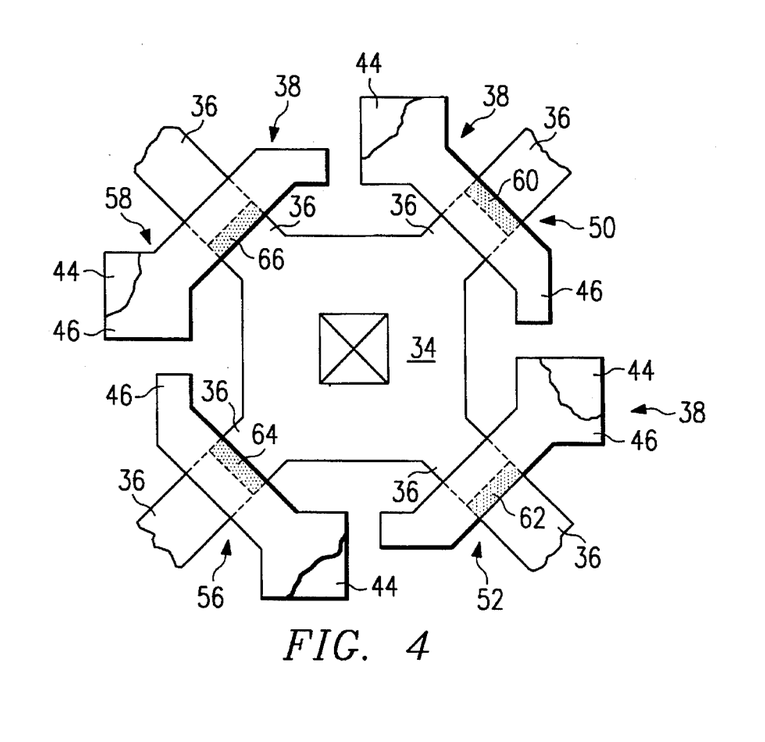
FIG. 4 illustrates a detail of one set of cells in the X-cell layout.

Referring now to FIG. 4, there is illustrated a detailed layout of one of the diffusion regions 34 and four of the transistors associated therewith. Each of the floating gate structures 38 are comprised of a floating gate 44 disposed over the channel region between the source/drain regions 36 and separated therefrom by an insulating oxide layer of approximately 100Å. The floating gate 44 is formed from a layer of doped poly. Thereafter, an interlevel oxide (ILO) layer of an oxide/nitride sandwich material is disposed over the control gate 44 to a thickness of approximately 300Å. A control gate is then disposed over the floating gate 44 s the row line (not shown). Typically, as will be described hereinbelow, this is a self-aligned process, wherein a first layer of polysilicon is disposed over the substrate followed by formation of the ILO on the upper surface thereof. The second polysilicon layer is then disposed over the ILO and then patterned and etched to form the overall row line/ control gate/floating gate structure. It is noted that the row line/control gate/floating gate structure extends over the field oxide layer to provide a higher degree of coupling between the floating gate 44 and the control gate.

The transistors associated with the region 34, although formed such that the source/drain regions associated with the diffusion region 34 share a common conductive area, are "asymmetric". This asymmetry results in a reach-through region being formed on only one side of the channel. There are illustrated four transistors, transistor 50, transistor 52, transistor 56 and transistor 58 formed about the common diffusion region 34. However, transistor 50 has a reach-through region 60 formed on the opposite side of the channel from the diffusion region 34 and the transistor 52 also has a reach-through region 62 formed on the opposite side of the channel region from the diffusion region 34. Therefore, the transistors 50 and 52 have the drains thereof connected to the diffusion region 34. Conversely, transistor 56 has a reach-through region 64 disposed on the same side of the channel region thereof as the common diffusion region 34, and transistor 52 has a reach-through region 66 disposed on the same side of the channel region of transistor 58 as the diffusion region 34. Therefore. The diffusion region 34 constitutes the sources of the transistors 56 and 58. As such, in order to erase the transistors 58 and 56, it is necessary to dispose the negative medium voltage on the control gates of transistors 56 and 58 and dispose a positive medium voltage on the region 34. However, if a negative medium voltage is disposed on the control gates of either the transistors 50 or 52, they will not have the charge on the floating gate 44 disturbed, due to the asymmetric construction.

Figures 5, 6, 7:
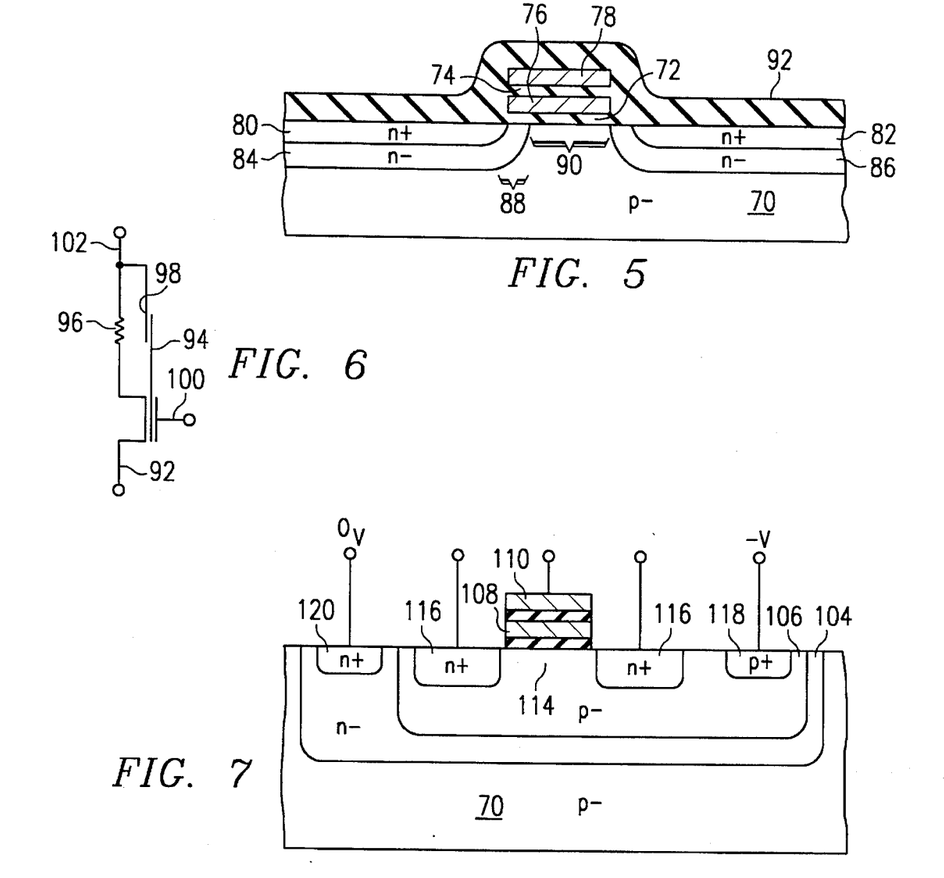
FIG. 5 illustrates a cross-sectional view of one of the EEPROM memory cells.
FIG. 6 illustrates an equivalent circuit for the transistor of FIG. 5.
FIG. 7 illustrates a cross-sectional view of a cell illustrating the high-voltage tank.

Referring now to FIG. 5, there is illustrated a cross-sectional diagram of each of the transistors 50, 52, 56 and 58 taken through the channel region. This transistor is an N-channel transistor which is formed on a P-type substrate 70. The active region is formed in a conventional manner and, thereafter, a layer of thin oxide grown by thermal oxidation to a thickness of approximately 100Å to form a gate oxide layer 72. A layer of polycrystalline silicon (Poly) is disposed over the entire surface using standard techniques to a thickness of about 2000Å. It is then patterned to define the various floating gates and the separation therebetween. This is followed by the formation of the layer of gate oxide to a thickness of approximately 300Å, which will form the gate oxide layer 74 between the floating gate and the control gate. This is followed by deposition of a second level Poly layer over the entire surface and then patterning and etching of both the first Poly layer and the second Poly layer to form a floating gate 76 and a control gate 78, this being a self-aligned process. As such, the floating gate 76 will be separated from the substrate 70 by the thin gate oxide layer 72 and the control gate 78 will be separated from the floating gate 76 by the thicker gate oxide layer 74.

Following the formation of the floating gate 76 and control gate 78, a layer of oxide is formed over the entire surface to provide a conformal layer of oxide. This layer is then subjected to a directional or anisotropic etch using a plasma etch, as disclosed in U.S. Pat. No. 4,297,162, for example, to remove the oxide on all horizontal surfaces and leave sidewall oxide layers on the sidewalls of the floating gate 76 and gate electrode 78. This is a conventional technique. Thereafter, a resist layer is applied and patterned such that only one of the sidewall oxide layers will remain. This will remove the sidewall oxide layer from the source side of the transistor.

The photoresist layer is removed and then an arsenic implant is performed to create heavily doped source/drain regions 80 and 82. This is followed by a phosphorous implant to a dosage of about $8 \times 10^{14}$ to $2 \times 10^{14}$ ions per cm$^3$. The substrate is then annealed at a temperature of approximately 950° C. to 1000° C. to cause lateral diffusion of the phosphorous implant, resulting in lightly doped regions 84 and 86, region 84 underlying region 80 and region 86 underlying region 82. It is noted that region 84 underlies a portion of the floating gate 76. This is referred to as a reach-through region 88, it being noted that, due to the way the sidewall oxides were formed, that the region 86 does not undercut the floating gate 76. As such, whenever a high voltage is disposed on the control gate 78 and a low voltage disposed on the source/drain implant 80, comprising the source of the transistor in this example, Fowler-Nordheim tunneling will occur at the reach-through region 80 and electrons will flow therethrough to the floating gate 76 to negatively charge the floating gate 76, thereby raising the threshold of the transistor. The channel region of the transistor comprises an area 90 disposed between the regions 84 and 86.

After formation of the source/drain regions 82 and the reach-through region 88, a layer of oxide 92 is disposed over the substrate, followed by formation of source/drain contacts (not shown) and the formation of metal layers (not shown) to contact the various regions. The structure of the transistor of FIG. 5 is disclosed in U.S. Pat. No. 4,742,492, issued May 3, 1988, which is incorporated herein by reference.

Referring now to FIG. 6, there is illustrated an equivalent circuit for the transistor of FIG. 5. The transistor consists of a drain 92, a floating gate 94, a body resistance corresponding to the reach-through region 88 and a tunnel diode 98. The tunnel diode 98 constitutes the reach-through path of the reach-through region 88 overlapped by the floating gate 94. A control gate 100 is disposed over the floating gate and a source 102 is connected to the other side of the body resistance 96. With the drain 92 floating, the source 102 disposed at ground potential and a high voltage applied to a control gate 100, tunneling of electrons will occur across the oxide layer 72 in the reach-through region 88. This will charge the floating gate negatively. This corresponds to a WRITE operation. In an ERASE mode, the drain 92 will again float, the source 18 will be disposed at a positive voltage, in the preferred embodiment the medium voltage, and a negative medium voltage will be applied to the control gate 100. This will cause electrons to tunnel from the floating gate 94 to the reach-through region 88 and charge the floating gate 94 positively.

In the READ mode, the source 102 is disposed at a precharged voltage and then a voltage of 3.0 volts is disposed on the control gate 100, which is connected to the row line of the array when the transistor is selected. If it is not selected, a voltage of −3.0 volts is disposed on the control gate of the transistor. With a negatively charged floating gate 94, no current will flow through the channel and the pre-charge voltage will therefore remain constant. However, if the floating gate 94 has been positively charged, then current will flow from the source 102 to the drain 92 and the precharged voltage will fall. This is then sensed by the sense amplifier. However, an alternate method can be utilized, wherein the Bit Line is precharged and the source of the transistor disposed at ground and the sense amplifier then sensing the precharged voltage to determine if the transistor is conductive Referring now to FIG. 7, there is illustrated a more detailed diagram of how the transistor is protected from unwanted parasitic transistors. In this technique, the substrate 70 has an N− well 104 formed therein by implanting a low dosage of N-type impurities into the substrate 70. This is followed by the formation of a P− region 106 within the N− region 104. The regions are driven into the substrate 70 by an annealing process such that the region 104 is driven deeper than the region 106 and, therefore, the N− region 104 surrounds the P-region 106. Thereafter, a transistor is formed with a stacked gate comprised of a floating gate 108 and control gate 110 formed over a channel region 114. Thereafter, N+ source/drain regions 116 are formed on either side of the channel region 114 in accordance with the techniques described above with respect to FIG. 5. A P+ contact region 118 is formed in the P− region 106 and an N+ contact region 120 is formed in the N− region 104. The N+ region 120 is disposed at a ground reference voltage and the P− region 106 is disposed at a negative voltage relative to the N− region 104. As such, the PN junction between regions 104 and 106 will be reverse biased and, therefore, the current will not flow. Therefore, whenever the source of the transistor at one of the source/drain regions 116 is disposed at a negative voltage relative to the P− substrate 70, conduction will not occur across the PN junction. This constitutes a high voltage tank structure, which is described in U.S. Pat. No. 5,157,281, issued Oct. 20, 1992, which is incorporated herein by reference.

Figure 8:
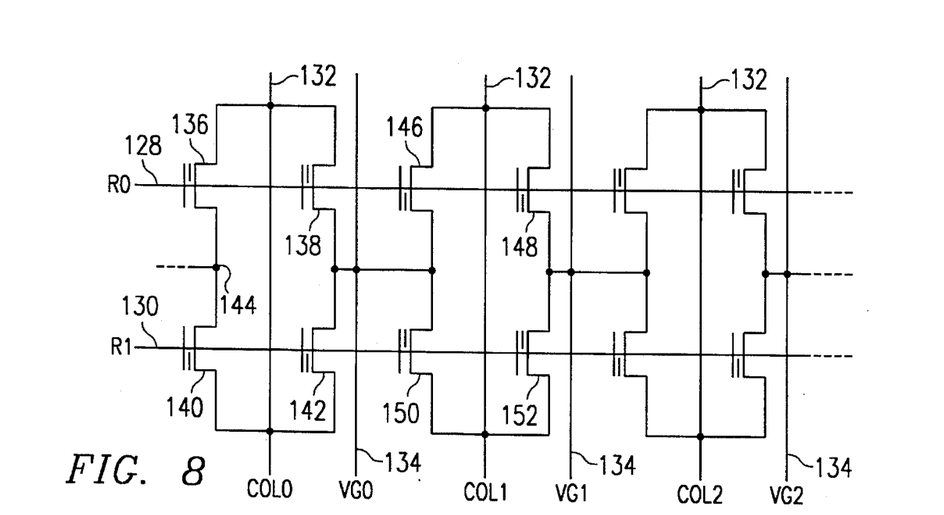
FIG. 8 illustrates a schematic diagram of an H-cell layout utilizing the asymmetric cells of the present invention.

Referring now to FIG. 8, there is illustrated an array utilizing an H-cell configuration and the asymmetric transistors of the present invention. The array is illustrated with two row lines 128, labelled R0, and 130, labelled R1. A plurality of Column Lines 132 are illustrated labelled COL0, COL1 and COL2. A plurality of virtual ground lines 134 are illustrated labelled VG0, VG1 and VG2.

Each of the Column Lines 132 has four memory cells associated therewith. Column Line COL0 has memory cells 136, 138, 140 and 142 associated therewith, each comprising an asymmetric transistor, as described above with reference to FIG. 2. Each of the transistors 136–142 has the other side of the source/drain paths thereof connected to a node 144, with the other side of the source/drain paths of transistors 138 and 142 connected together and to the VG0 line 134. The Column Line COL1 has four memory cells 146, 148, 150 and 152 associated therewith. However, the transistors 146–152 are configured such that the side of the source/drain path of each of the transistors opposite to the programming side thereof is connected to the Column Line COL1. The programming sides of the transistors 146 and 150 are connected to the virtual ground lines VG0 and the programming side of the transistors 148 and 152 are connected to the virtual ground line VG1.

In order to FLASH WRITE all of the memory cells, it is necessary to apply a positive medium voltage to all the row lines and then apply a negative medium voltage to all of the column or virtual ground lines. This will thereby negatively charge the floating gates. In order to selectively ERASE one of the cells, it is necessary to dispose the associated row line at a negative medium voltage, and dispose the one of the associated virtual ground lines or Column Lines connected to the programming side of the transistors at a positive medium voltage with the remaining virtual ground lines and Column Lines remaining at a zero voltage. For example, if memory cell 146 were to be erased, it would be necessary to dispose the row line 128 at a negative voltage and the programming side of the transistor 146 connected to the VG0 line at a positive voltage. The row line 130 connected to the control gate of transistor 150 would be disposed at a zero voltage such that only the medium voltage is disposed across the gate and source thereof, and not the full programming voltage. Therefore, the charge on the floating gate of transistor 150 would not be disturbed. Further, the two transistors 138 and 142, having the "drains" thereof connected to the VG0 line, would not have the charge on the floating gates thereof disturbed, since the programming side of the transistors is not connected to the VG0 line. It is noted that when either the transistors 138 or 142 are erased, it is necessary to dispose the Column Line COL0 at the positive medium voltage with the selected gate of the erased one of the transistors connected to a negative medium voltage. During a Read operation, the row associated with the selected transistors is connected to +3 volts, the associated virtual ground line connected to a precharged voltage and the associated Column Line connected to the sense amp. For example, if transistor 146 were to be READ, the row line 121 would be connected to a positive three volts, the row line 130 connected to a negative three volts, the VG0 line connected to a precharged voltage and the Column Line COL1 connected to a sense amp. This would effectively turn off transistor 150 such that the sense amp would only sense conduction or no conduction through the transistor 146. Alternately, the virtual ground line could be connected to ground and the Column Line precharged. The sense amp would then sense whether the selected cell discharged the Column Line to determine if it was conductive.

Figure 9:
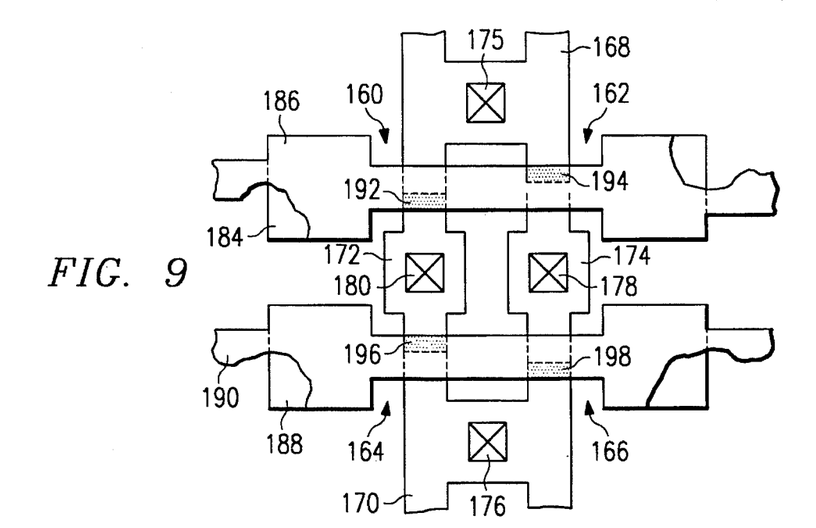
FIG. 9 illustrates a top view of the layout of the H-cell configuration.

Referring now to FIG. 9, there is illustrated a layout for the array of FIG. 8, illustrating transistors 160, 162, 164 and 166. A common diffusion region 168 is provided which constitutes the programming side of transistor 162 and the non-programming side of transistor 160. A common diffusion region 160 is provided which constitutes the programming side of transistor 166 and the non-programming side of transistor 164. The other source/drain diffusion of transistors 160 and 164 is a common diffusion region 172. Similarly, a common diffusion region 174 is provided which constitutes the other source/drain regions of transistors 166 and 168. A contact 175 is provided to the diffusion region 168 and a contact 176 is provided to the diffusion region 170. A contact 178 is provided to the source/drain region 174 and a contact 180 is provided to the source/drain region 172.

A control gate/floating gate structure is provided over each of the channel regions of the transistors 160–166. The control gate/floating gate structure of transistors 160 and 162 is comprised of a floating gate 184 that underlies a control gate 186. The control gate 186 constitutes the row line of the transistors 160 and 162. Similarly, a floating gate 188 underlies a control gate 190, which constitutes a control gate/floating gate structure for transistors 164 and 166.

Transistor 160 has a reach-through region 192 associated therewith on the source/drain region 172 side. The transistor 162 has a reach-through region 194 on the diffusion region 168 side thereof. The transistor 164 has a reach-through region 196 on the source/drain region 172 side thereof. The transistor 166 has a reach-through region 198 on the diffusion region 170 side thereof.

Figure 10:
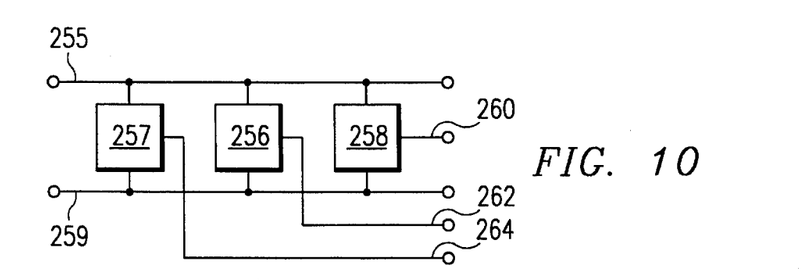
FIG. 10 illustrates a block diagram of the electrical circuit for providing the various voltage levels required by each cell.
Figure 11:
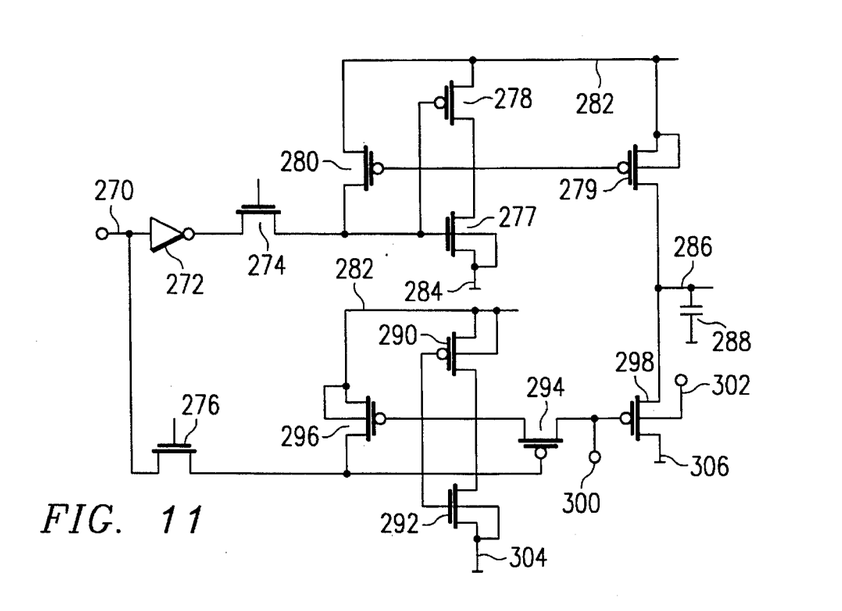
FIG. 11 illustrates a schematic diagram of a circuit for driving each Word Line of the array.

The circuitry required to drive the cells 24 illustrated in FIG. 2 is indicated by FIGS. 10 and 11. FIG. 10 shows a block diagram form the circuit required to produce the bipolar voltage levels required while FIG. 11 shows a switching circuit required to drive each line with a voltage required for a particular mode of operation.

In FIG. 10, a single voltage source of, for example, 5 volts is used as an input along line a 255 with a line 259 being ground or substrate voltage. Three charge pumps 257, 256 and 258 the design of which are well known in the art are coupled in parallel across lines 258 and 259. Each charge pump 257, 256 and 258 produces output voltages $-V_{gg}$, $-V_{pp}$ and $+V_{pp}$ on associated output lines 264, 262 and 260, respectively.

The circuit of FIG. 11 functions in response to input control signals received on input line 270 which are fed in parallel to an inverter 272 and through the source-to-drain of a field effect transistor 276 whose gate is at $V_{dd}$ or +5 volts. The inverter 272 output also passes through a field effect transistor 274 whose gate is at $V_{dd}$ or +5 V. The output from transistor 274 couples in parallel to the gates of an N-channel transistor 277 and a P-channel transistor 278 and to the drain of a P-channel transistor 280 to which the source of transistor 280 connects to the $V_{pp}$ line 282 and its gate connects to the drain of transistor 277. The source of transistor 277 is connected to ground at a $V_{ss}$ line 284 while the source of transistor 278 is connected to the $V_{pp}$ line 282.

The output from transistor 276 couples to the gates of transistors 290, 292 and 294, with transistors 290 and 294 being P-channel transistors. The drains of transistors 290 and 292 couple to the gate of transistor 296 and to the source of transistor 294. The drain of transistor 294 couples both to a $V_{gg}$ line 300 and to the gate of a P-channel transistor 298. Transistor 296 has the source thereof connected to the $V_{pp}$ line 282 and the drain thereof connected an output of transistor 276. The source of transistor 290 connects to the $V_{pp}$ line 282 while the source of transistor 292 is connected to the $V_{ss}$ line 104.

Output transistor 279 has the source thereof connected to the $V_{pp}$ line 282 and the drain thereof connected to the output line 286 while its complementary driver transistor 298 has the drain thereof connected to the $-V_{pp}$ line 306 and the source thereof connected to the line 286. Line 286 is charged and discharged by output capacitor 288 connected to $V_{ss}$.

In operation, a zero voltage input on input line 270 results in a positive signal at the output of inverter 272 which is applied to the gates of transistors 277 and 278. In response, transistor 277 turns on grounding the gates of transistors 279 and 280 and turning on both of the latter. Thus, transistor 279 in turning on connects the $V_{pp}$ line 282 to the output line 286. The charge pump 258 is operative to charge capacitor 288 to $+V_{pp}$. Simultaneously, transistor 280 couples $V_{pp}$ line 282 to the gates of transistors 277 and 278 thereby maintaining transistor 277 in an ON state and ensuring that there is no net voltage across the source-gate of transistor 278 so that the latter is cut off. Transistor 274 blocks the transmission of $V_{pp}$ to the output of inverter 272. Thus, capacitor 288 is charged through the channel resistance of transistor 279 to $V_{pp}$.

A zero output applied through transistor 276 turns on transistors 290 and 294 coupling $+V_{pp}$ on line 282 to the gate of transistor 298 and maintaining the latter OFF.

With an input signal at a logic "1", inverter 272 applies a logic "0" signal to the gates of transistors 277 and 278 turning on transistor 278 and applying $V_{pp}$ on line 282 to the gate of transistor 279. Transistor 279 is thus turned and/or maintained OFF.

An input signal at the logic "1" state turns on transistor 92 which applies zero volts to the source of transistor 292 and maintains the latter off. The $-V_{gg}$ and $-V_{pp}$ charge pumps 257 and 256 are then activated and transistor 298 turns on charging line 286 towards $-V_{pp}$. At the same time the $V_{pp}$ line 282 is tied to $V_{dd}$ lines 255.

Clearly, a variety of different voltages could be produced by the circuit of FIG. 10 depending upon the requirements. For the cells of FIG. 1, the combination +18 v, −9 v and 3.0 v, 0 v and −3 v would be appropriate for the row line, and +9 v and 0 v for the bit or read line.

In summary, there has been provided a Flash EEPROM memory array that utilizes an X-Cell layout. Each of the cells in the X-Cell layout is comprised of a floating gate EEPROM memory cell which is asymmetric in that it can only be programmed from one side thereof. Each of the Column Lines has common diffusion nodes which are connected to the sources of two transistors in separate rows and to the drains of two transistors in two separate rows. The programming side of the transistors is such that, in a given row, only one of the transistors has the programming side thereof connected to the common diffusion region. The entire array is subjected to a FLASH WRITE operation by disposing the row lines at a positive medium voltage and the Column Lines at a negative medium voltage to negatively charge the floating gates via a Fowler-Nordheim tunneling diode on the programming side of the transistors. Each of the cells can be selectively erased for the purposes of programming thereof by disposing all the Column Lines at a zero voltage with the exception of the Column Line associated with the select transistor, this being disposed at a positive medium voltage. The Word Line for the select transistor is disposed at a negative medium voltage. With respect to the two transistors associated with the same Column Line and same row line, only the one having the programming side connected to the Column Line will be erased. Each of the transistors in each of the memory cells is disposed in a high voltage tank that is of opposite conductivity type to that surrounding the channel region. The voltage of this high voltage tank is at a voltage less than the substrate such that a reverse biased PN junction is formed, thus allowing negative voltages to be placed on the source/drain of the memory cell transistors.

Although the preferred embodiment has been described in detail, it should be understood that various changes, substitutions and alterations can be made therein without departing from the spirit and scope of the invention as defined by the appended claims.

What is claimed is:

1. An electrically programmable, non-volatile memory cell arrangement, in a semiconductor substrate, comprising:

a first doped region in said substrate of a first conductivity type, having
a central portion, and
first, second, third and fourth source/drain portions extending outwardly from said central portion;

second, third, fourth and fifth doped regions in said substrate of said first conductivity type, being disposed adjacent to and separated from, by a second conductivity type region forming a channel therebetween, said first, second, third and fourth source/drain portions, respectively;

a first floating gate structure and a second floating gate structure disposed on top of said channels formed between said first source/drain portion and said second doped region, and said second source/drain portion and said third doped region, respectively, and a first control gate structure and a second control gate structure disposed on top of said first and said second floating gate structures, respectively, forming a first storage transistor and a second storage transistor operable to be programmed by Fowler-Nordheim tunneling from only the side of said channels closest to said second doped region and said third doped region, respectively; and a third and a fourth floating gate structure disposed on top of said channels formed between said third source/drain portion and said fourth doped region, and said fourth source/drain portion and said fifth doped region, respectively, and third and fourth control gate structures disposed on top of said third and said fourth floating gate structures, respectively, forming a third storage transistor and a fourth storage transistor operable to be programmed by Fowler-Nordheim tunneling from only the side of said channels closest to said third source/drain portion and said fourth source/drain portion, respectively.

2. A memory cell arrangement according to claim 1, wherein said first, second, third and fourth storage transistors are operable to be programmed by Fowler-Nordheim tunneling from only one side by having a reach-through region formed on only said one side, at which said Fowler-Nordheim tunneling occurs.

3. A memory cell arrangement according to claim 2, wherein said reach-through region comprises an extension of said third source/drain portion and said fourth source/drain portion under said third floating gate structure and said fourth floating gate structure, respectively, and further comprises an extension of said second doped region and said third doped region under said first floating gate structure and said second floating gate structure.

4. A memory cell arrangement according to claim 1, wherein said central portion of said first doped region is substantially rectangular in configuration with the source/drain regions extending from the corners thereof.

5. An electrically programmable, non-volatile memory cell array, in a semiconductor substrate, comprising a plurality of memory cell arrangements, each of said arrangements comprising:

a first doped region in said substrate of a first conductivity type, having
a central portion, and
first, second, third and fourth source/drain portions extending outwardly from said central portion;

second, third, fourth and fifth doped regions in said substrate of said first conductivity type, being disposed adjacent to and separated from, by a second conductivity type region forming a channel therebetween, said first, second, third and fourth source/drain portions, respectively;

a first and a second floating gate structure disposed on top of said channels formed between said first source/drain portion and said second doped region, and said second source/drain portion and said third doped region, respectively, and first and second control gate structures disposed on top of said first and said second floating gate structures, respectively, forming first and second storage transistors operable to be programmed by Fowler-Nordheim tunneling from only the side of said channels closest to said second doped region and said third doped region, respectively; and a third and a fourth floating gate structure disposed on top of said channels formed between said third source/drain portion and said fourth doped region, and said fourth source/drain portion and said fifth doped region, respectively, and third and fourth control gate structures disposed on top of said third and said fourth floating gate structures, respectively, forming third and fourth storage transistors operable to be programmed by Fowler-Nordheim tunneling from only the side of said channels closest to said third source/drain portion and said fourth source/drain portion, respectively;

wherein said memory cell arrangements are arranged in an array and interconnected such that the second, third, fourth and fifth doped region of one such arrangement comprises a source/drain portion of a different one of four such arrangements adjacent to such one arrangement.

6. An electrically programmable, non-volatile memory cell arrangement, in a semiconductor substrate, for use in an array, comprising:

a first doped region in said substrate of a first conductivity type, having
a central portion,
first and second drain portions extending outwardly from said central portion, and
first and second source portions extending outwardly from said central portion;

second, third, fourth and fifth doped regions in said substrate of said first conductivity type, being disposed adjacent to and separated from, by a second conductivity type region forming a channel therebetween, said first and second drain portions and said first and second source portions, respectively;

a first and a second floating gate structure disposed on top of said channels formed between said first drain portion and said second doped region, and said second drain portion and said third doped region, respectively, and first and second control gate structures disposed on top of said first and said second floating gate structures, respectively, forming first and second storage transistors operable to be programmed by Fowler-Nordheim tunneling from only the side of said channels closest to said second doped region and said third doped region, respectively; and a third and a fourth floating gate structure disposed on top of said channels formed between said first source portion and said fourth doped region, and said second source portion and said fifth doped region, respectively, and third and fourth control gate structures disposed on top of said third and said fourth floating gate structures, respectively, forming third and fourth storage transistors operable to be programmed by Fowler-Nordheim tunneling from only the side of said channels closest to said first source portion and said second source portion, respectively.

* * * * *